(12) United States Patent
Arthur et al.

(10) Patent No.: US 8,812,414 B2
(45) Date of Patent: Aug. 19, 2014

(54) LOW-POWER EVENT-DRIVEN NEURAL COMPUTING ARCHITECTURE IN NEURAL NETWORKS

(75) Inventors: John V. Arthur, Mountain View, CA (US); Paul A. Merolla, Palo Alto, CA (US); Dharmendra S. Modha, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 324 days.

(21) Appl. No.: 13/149,754

(22) Filed: May 31, 2011

(65) Prior Publication Data

US 2014/0114893 A1      Apr. 24, 2014

(51) Int. Cl.
| | |
|---|---|
| G06E 1/00 | (2006.01) |
| G06E 3/00 | (2006.01) |
| G06F 15/18 | (2006.01) |
| G06G 7/00 | (2006.01) |
| G06N 3/02 | (2006.01) |

(52) U.S. Cl.
USPC .......................................................... 706/15

(58) Field of Classification Search
None
See application file for complete search history.

(56) References Cited

U.S. PATENT DOCUMENTS

| | | | |
|---|---|---|---|
| 4,893,255 A | 1/1990 | Tomlinson, Jr. | |
| 5,083,285 A | 1/1992 | Shima et al. | |
| 5,155,802 A | 10/1992 | Mueller et al. | |
| 5,336,937 A | 8/1994 | Sridhar et al. | |
| 5,381,515 A | 1/1995 | Platt et al. | |
| 5,404,556 A | 4/1995 | Mahowald et al. | |
| 6,557,070 B1 | 4/2003 | Noel, Jr. | |
| 6,710,623 B1 | 3/2004 | Jones et al. | |
| 7,259,587 B1 | 8/2007 | Schmit et al. | |
| 7,392,230 B2 * | 6/2008 | Nugent | 706/15 |
| 7,426,501 B2 | 9/2008 | Nugent | |
| 7,457,787 B1 | 11/2008 | Furber | |
| 7,502,769 B2 | 3/2009 | Nugent | |

(Continued)

FOREIGN PATENT DOCUMENTS

EP             10569764 A2       11/1993

OTHER PUBLICATIONS

Point-to-Point Connectivity Between Neuromorphic Chips using Address-Events Kwabena A. Boahen.*

(Continued)

Primary Examiner — Kakali Chaki
Assistant Examiner — Ababacar Seck
(74) Attorney, Agent, or Firm — Kenneth L. Sherman, Esq.; Michael Zarrabian, Esq.; Sherman & Zarrabian LLP

(57) ABSTRACT

A neural network includes an electronic synapse array of multiple digital synapses interconnecting a plurality of digital electronic neurons. Each synapse interconnects an axon of a pre-synaptic neuron with a dendrite of a post-synaptic neuron. Each neuron integrates input spikes and generates a spike event in response to the integrated input spikes exceeding a threshold. A decoder receives spike events sequentially and transmits the spike events to selected axons in the synapse array. An encoder transmits spike events corresponding to spiking neurons. A controller coordinates events from the synapse array to the neurons, and signals when neurons may compute their spike events within each time step, ensuring one-to-one correspondence with an equivalent software model. The synapse array includes an interconnecting crossbar that sequentially receives spike events from axons, wherein one axon at a time drives the crossbar, and the crossbar transmits synaptic events in parallel to multiple neurons.

25 Claims, 14 Drawing Sheets

(56) References Cited

U.S. PATENT DOCUMENTS

| | | | |
|---|---|---|---|
| 7,512,572 | B2 | 3/2009 | Furber |
| 7,599,895 | B2 | 10/2009 | Nugent |
| 7,657,313 | B2 | 2/2010 | Rom |
| 7,818,273 | B2 * | 10/2010 | Ananthanarayanan et al. 706/15 |
| 7,877,342 | B2 | 1/2011 | Buscema |
| 7,978,510 | B2 | 7/2011 | Modha et al. |
| 8,250,010 | B2 | 8/2012 | Modha et al. |
| 8,473,439 | B2 | 6/2013 | Arthur et al. |
| 8,510,239 | B2 | 8/2013 | Modha |
| 8,515,885 | B2 | 8/2013 | Modha |
| 8,527,438 | B2 | 9/2013 | Jackson et al. |
| 8,606,732 | B2 | 12/2013 | Venkatraman et al. |
| 2008/0275832 | A1 | 11/2008 | McDaid et al. |
| 2009/0292661 | A1 | 11/2009 | Haas |
| 2009/0313195 | A1 | 12/2009 | McDaid et al. |
| 2010/0299297 | A1 * | 11/2010 | Breitwisch et al. ............. 706/33 |
| 2011/0153533 | A1 | 6/2011 | Jackson et al. |
| 2012/0084240 | A1 | 4/2012 | Esser et al. |
| 2012/0084241 | A1 | 4/2012 | Friedman et al. |
| 2012/0109863 | A1 | 5/2012 | Esser et al. |
| 2012/0173471 | A1 | 7/2012 | Ananthanarayanan et al. |
| 2012/0259804 | A1 * | 10/2012 | Brezzo et al. ................... 706/25 |
| 2013/0031040 | A1 | 1/2013 | Modha |
| 2013/0073497 | A1 | 3/2013 | Akopyan et al. |
| 2013/0325765 | A1 | 12/2013 | Hunzinger |
| 2013/0325767 | A1 | 12/2013 | Hunzinger |
| 2014/0032460 | A1 | 1/2014 | Cruz-Albrecht et al. |
| 2014/0074761 | A1 | 3/2014 | Hunzinger |

OTHER PUBLICATIONS

Exploiting Memristance for Implementing Spike-Time-Dependent-Plasticity in Neuromorphic Nanotechnology Systems B. Linares-Barranco and T. Serrano-Gotarredona Instituto de Microelectronica de Sevilla (IMSE-CNM-CSIC), Av. Americo Vespucio sin, 41092 Sevilla, Spain.*

Virtual Synaptic Interconnect Using an Asynchronous Network-on-Chip Alexander D. Rast, Shufan Yang, Mukaram Khan, Steve B. Furber.*

The Handbook of Brain Theory and Neural Networks.*

A Delay-Insensitive Address-Event Link Joseph Lin Department of Electrical and Computer Engineering Johns Hopkins University, Baltimore, MD 21218 Email: linjh@jhu.edu Kwabena Boahen Department of Bioengineering Stanford University, Stanford, CA 94305 Email: boahen@stanford.edu.*

Karmarkar, U.R. et al., "Mechanisms and significance of spike-timing dependent plasticity", Biological Cybernetics, Jan. 28, 2002, pp. 373-382, vol. 87, No. 5-6, Springer-Verlag, Germany.

Boahen, K.A., "A Burst-Mode Word-Serial Address-Event Link—I: Transmitter Design", IEEE Transactions on Circuits and Systems—I: Regular Papers, Jul. 2004, pp. 1269-1280, vol. 51, No. 7, IEEE, United States.

Arthur, J.V. et al., "Learning in Silicon: Timing is Everything", Advances in Neural Information Processing Systems 18, 2006, pp. 1-8, MIT Press, United States.

Martin, A.J. "Asynchronous Datapaths and the Design of an Asynchronous Adder", Formal Methods in System Design, 1992, pp. 1-24, vol. 1:1, Kluwer, United States.

Lazzaro, J. et al., "Silicon auditory processors as computer peripherals," IEEE Transactions on Neural Networks, May 1993, pp. 523-528, vol. 4, No. 3, IEEE, United States.

Merolla, P.A. et al., "Expandable Networks for Neuromorphic Chips," IEEE Transactions on Circuits and Systems—I: Regular Papers, Feb. 2007, pp. 301-311, vol. 54, No. 2, IEEE, United States.

Mezard, M. et al., "Learning in feedforward layered networks: the tiling algorithm," Journal of Physics A: Mathematical and General, 1989, pp. 2191-2203, vol. 22, No. 12, IOP Publishing Ltd., United Kingdom.

Patel, G.N. et al., "An Asynchronous Architecture for modeling Intersegmental Neural Communication," IEEE Transactions on Very Large Scale Integration (VLSI) Systems, Feb. 2006, pp. 97-110,vol. 14, No. 2, IEEE, United States.

Garrido, J.A. et al., "Event and Time Driven Hybrid Simulation of Spiking Neural Networks," Proceedings of the 2011 International Work-Conference on Artifical Neural Networks (IWANN 2011), Jun. 8-10, 2011, pp. 554-561, Vo. 6691, Spain.

Rochel, O. et al.,"An event-driven framework for the simulation of networks of spiking neurons," Proceedings of the 2003 European Symposium on Artificial Neural Networks Bruges (ESANN'2003), Apr. 23-25, 2003, pp. 295-300, Beglium.

U.S. Non-Final Office Action for U.S. Appl. No. 13/235,341 mailed Dec. 24, 2013.

Garrido, J.A. et al., "Event and Time Driven Hybrid Simulation of Spiking Neural Networks," Proceedings of the 2011 International Work-Conference on Artifical Neural Networks (IWANN 2011), 8-10 Jun. 8-10, 2011, pp. 554-561, Vo. 6691, Spain.

Rochel, O. et al., "An event-driven framework for the simulation of networks of spiking neurons," Proceedings of the 2003 European Symposium on Artificial Neural Networks Bruges (ESANN'2003), Apr. 23-25, 2003, pp. 295-300, Beglium.

Marian, I. et al., "Efficient event-driven simulation of spiking neural networks," Proceedings of the 2002 3rd WSEAS International Conference on Neural Networks and Applications, 2002, pp. 1-7, Ireland.

Yudanov, D. et al., "GPU-Based Simulation of Spiking Neural Networks with Real-Time Performance & High Accuracy," Proceedings of the WCCI 2010 IEEE World Congress on Computational Intelligence, Jul. 18-23, 2010, pp. 2143-2150, United States.

Merolla, P.A. et al., "Expandable Networks for Neuromorphic Chips," Proceedings of the 2007 IEEE Transactions on Circuits and Systems, pp. 301-311, vol. 54, No. 2, United States.

Boucheny, C. et al., "Real-Time Spiking Neural Network: An Adaptive Cerebellar Model,"Proceedings of the 2005 8th International Work-Conference on Artificial Neural Networks (IWANN 2005), Jun. 8-10, 2005, pp. 136-144, United States.

Makino, T. et al., "A Discrete-Event Neural Network Simulator for General Neuron Models," Proceedings of the 2003 Neural Computing & Applications, Jun. 2003, pp. 210-223, vol. 11, Issue 3-4, United States.

Brette, R. et al., "Simulation of networks of spiking neurons: A review of tools and strategies," J Comput Neurosci Dec. 23, 2007, pp. 349-398, United States.

Djureldt, M., "Large-scvale Simulation of Neuronal Systems", KTH School of Computer Science and Communication, Doctoral Thesis, Apr. 2009, pp. 1-200, Stockholm, Sweden.

Leibold, C., et al., "Mapping Time" Biological Cybernetics, Jun. 28, 2002, pp. 428-439, Springer-Verlag, Germany.

U.S. Final Office Action for U.S. Appl. No. 13/235,341 mailed Apr. 17, 2014.

* cited by examiner

LOW-POWER EVENT-DRIVEN NEURAL COMPUTING ARCHITECTURE IN NEURAL NETWORKS

This invention was made with Government support under HR0011-09-C-0002 awarded by Defense Advanced Research Projects Agency (DARPA). The Government has certain rights in this invention.

BACKGROUND

The present invention relates to neuromorphic and synaptronic systems, and in particular event driven circuits for neural networks.

Neuromorphic and synaptronic systems, also referred to as artificial neural networks, are computational systems that permit electronic systems to essentially function in a manner analogous to that of biological brains. Neuromorphic and synaptronic systems do not generally utilize the traditional digital model of manipulating 0s and 1s. Instead, neuromorphic and synaptronic systems create connections between processing elements that are roughly functionally equivalent to neurons of a biological brain. Neuromorphic and synaptronic systems may comprise various electronic circuits that are modeled on biological neurons.

In biological systems, the point of contact between an axon of a neuron and a dendrite on another neuron is called a synapse, and with respect to the synapse, the two neurons are respectively called pre-synaptic and post-synaptic. The essence of our individual experiences is stored in conductance of the synapses. The synaptic conductance changes with time as a function of the relative spike times of pre-synaptic and post-synaptic neurons, as per spike-timing dependent plasticity (STDP). The STDP rule increases the conductance of a synapse if its post-synaptic neuron fires after its pre-synaptic neuron fires, and decreases the conductance of a synapse if the order of the two firings is reversed.

BRIEF SUMMARY

Embodiments of the invention provide event-driven neural computing architecture for neural networks. According to an embodiment of the invention, a neural network includes an electronic synapse array of multiple digital synapses interconnecting a plurality of digital electronic neurons. Each synapse interconnects an axon of a pre-synaptic neuron with a dendrite of a post-synaptic neuron. Each neuron integrates input spikes and generates a spike event in response to the integrated input spikes exceeding a threshold. A decoder receives spike events sequentially and transmits the spike events to selected axons in the synapse array. An encoder transmits spike events corresponding to spiking neurons. A controller coordinates events from the synapse array to the neurons, and signals when neurons may compute their spike events within each time step, ensuring one-to-one correspondence with an equivalent software model. The synapse array includes an interconnecting crossbar that sequentially receives spike events from axons, wherein one axon at a time drives the crossbar, and the crossbar transmits synaptic events in parallel to multiple neurons.

These and other features, aspects and advantages of the present invention will become understood with reference to the following description, appended claims and accompanying figures.

DETAILED DESCRIPTION

Figure 1:
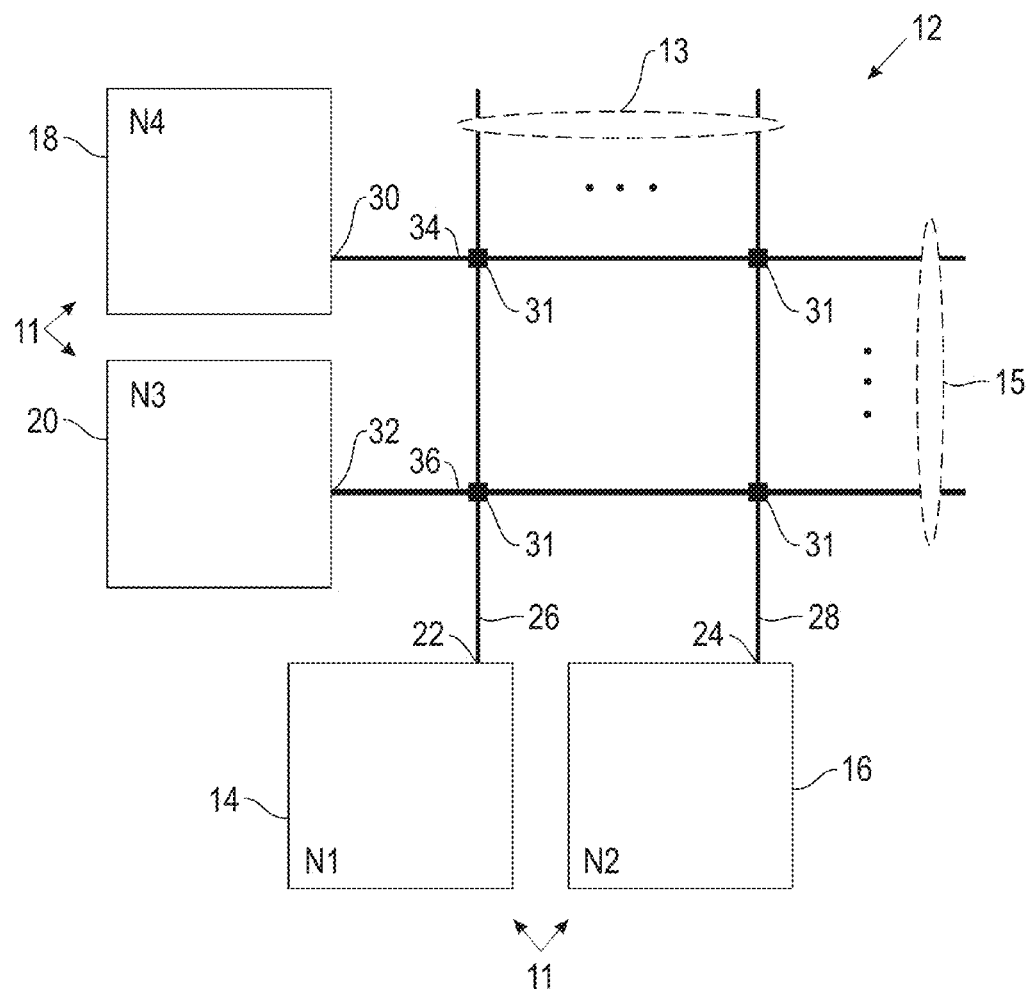
FIG. 1 shows a diagram of a neuromorphic and synaptronic network comprising a crossbar of electronic synapses interconnecting electronic neurons and axons, in accordance with an embodiment of the invention.

Embodiments of the invention provide event-driven neural computing architecture for neural networks. One embodiment provides a low-power event-driven neural computing architecture for a neural network comprising a low-power digital complementary metal-oxide-semiconductor (CMOS) spiking circuit implementing learning rules such as STDP on a crossbar memory synapse array interconnecting electronic neurons.

The term electronic neuron as used herein represents an architecture configured to simulate a biological neuron. An electronic neuron creates connections between processing elements that are roughly functionally equivalent to neurons of a biological brain. As such, a neuromorphic and synaptronic system comprising electronic neurons according to embodiments of the invention may include various electronic circuits that are modeled on biological neurons. Further, a neuromorphic and synaptronic system comprising electronic neurons according to embodiments of the invention may include various processing elements (including computer simulations) that are modeled on biological neurons. Although certain illustrative embodiments of the invention are described herein using electronic neurons comprising electronic circuits, the present invention is not limited to electronic circuits. A neuromorphic and synaptronic system according to embodiments of the invention can be implemented as a neuromorphic and synaptronic architecture comprising circuitry, and additionally as a computer simulation. Indeed, embodiments of the invention can take the form of an entirely hardware embodiment, an entirely software embodiment or an embodiment containing both hardware and software elements.

According to an embodiment of the invention, a neural network includes an electronic synapse array of multiple electronic synapses, such as digital synapses, interconnecting a plurality of electronic neurons, such as digital neurons. Each synapse interconnects an axon of a pre-synaptic neuron with a dendrite of a post-synaptic neuron. Each neuron integrates input spikes and generates a spike event in response to the integrated input spikes exceed a threshold. A neuron communicates with an axon in another (or the same) core by sending a spike event, encoded as an n-bit address representing its target axon, where the number of bits corresponds to the logarithm base 2 of number of axons in the core. Addresses are sent sequentially to the receiving core where a decoder then selects the corresponding target axon (1 out of 2^n). A controller coordinates events from the synapse array to the neurons, and signals when neurons may compute their spike events within each time step, ensuring one-to-one correspondence with an equivalent simulation model (such as software or program code simulation).

The controller sequences spike event activity within each time step for operation of the neural network and access to the synapse array in a continuous or discrete time manner, such that in the discrete-time case deterministic operation is guaranteed. The synapse array includes an interconnecting crossbar that sequentially receives spike events from axons, wherein one axon at a time drives (e.g., transmits signals to) the crossbar, and the crossbar transmits synaptic events in parallel to multiple neurons.

Referring now to FIG. 1, there is shown a diagram of an example neuromorphic and synaptronic tile circuit 10 having a crossbar 12 in accordance with an embodiment of the invention. In one example, the overall circuit may comprise an "ultra-dense crossbar array" that may have a pitch in the range of about 0.1 nm to 10 µm. The neuromorphic and synaptronic circuit 10 includes said crossbar 12 interconnecting a plurality of digital neurons 11 comprising neurons 14, 16, 18 and 20. These neurons 11 are also referred to herein as "electronic neurons". For illustration purposes, the example circuit 10 provides symmetric connections between the two pairs of neurons (e.g., N1 and N3). However, embodiments of the invention are not only useful with such symmetric connection of neurons, but also useful with asymmetric connection of neurons (neurons N1 and N3 need not be connected with the same connection).

In the example circuit 10, the neurons 11 are connected to the crossbar 12 via dendrite paths/wires (dendrites) 13 such as dendrites 26 and 28. Neurons 11 are also connected to the crossbar 12 via axon paths/wires (axons) 15 such as axons 34 and 36. Neurons 14 and 16 are dendritic neurons and neurons 18 and 20 are axonal neurons connected with axons 13. Specifically, neurons 14 and 16 are shown with outputs 22 and 24 connected to dendrites (e.g., bitlines) 26 and 28, respectively. Axonal neurons 18 and 20 are shown with outputs 30 and 32 connected to axons (e.g., wordlines or access lines) 34 and 36, respectively.

When any of the neurons 14, 16, 18 and 20 fire, they will send a pulse out to their axonal and to their dendritic connections. Each synapse provides contact between an axon of a neuron and a dendrite on another neuron and with respect to the synapse, the two neurons are respectively called pre-synaptic and post-synaptic.

Each connection between dendrites 26, 28 and axons 34, 36 are made through a digital synapse device 31 (synapse). The junctions where the synapse devices are located may be referred to herein as "cross-point junctions". In general, in accordance with an embodiment of the invention, neurons 14 and 16 will "fire" (transmit a pulse) in response to the inputs they receive from axonal input connections (not shown) exceeding a threshold. Neurons 18 and 20 will "fire" (transmit a pulse) in response to the inputs they receive from external input connections (not shown), typically from other neurons, exceed a threshold. In one embodiment, when neurons 14 and 16 fire they maintain a postsynaptic-STDP variable (post-STDP) variable that decays. For example, in one embodiment, the decay period may be 50 ms. The post-STDP variable is used to achieve STDP by encoding the time since the last firing of the associated neuron. Such STDP is used to control long-term potentiation or "potentiation", which in this context is defined as increasing synaptic conductance. When neurons 18, 20 fire they maintain a pre-STDP (presynaptic-STDP) variable that decays in a similar fashion as that of neurons 14 and 16.

Pre-STDP and post-STDP variables may decay according to exponential, linear, polynomial, or quadratic functions, for example. In another embodiment of the invention, the variables may increase instead of decreasing over time. In any event, this variable may be used to achieve STDP, by encoding the time since the last firing of the associated neuron. STDP is used to control long-term depression or "depression", which in this context is defined as decreasing synaptic conductance. Note that the roles of pre-STDP and post-STDP variables can be reversed with pre-STDP implementing potentiation and post-STDP implementing depression.

An external two-way communication environment may supply sensory inputs and consume motor outputs. Digital neurons 11 implemented using CMOS logic gates receive spike inputs and integrate them. In one embodiment, the neurons 11 include comparator circuits that generate spikes when the integrated input exceeds a threshold. In one embodiment, binary synapses are implemented using transposable 1-bit static random-access memory (SRAM) cells, wherein each neuron 11 can be an excitatory or inhibitory neuron (or both). Each learning rule on each neuron axon and dendrite are reconfigurable as described hereinbelow. This assumes a transposable access to the crossbar memory array. Neurons that spike are selected one at a time sending spike events to corresponding axons, where axons could reside on the core, or somewhere else in a larger system with many cores.

Figure 2:
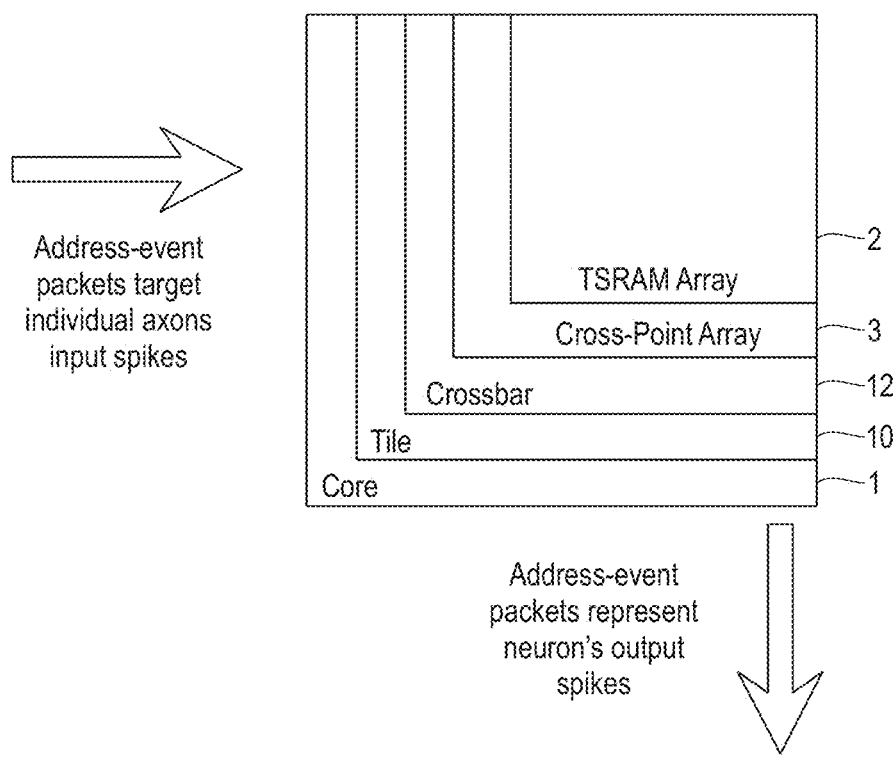
FIG. 2 shows a diagram of a neuromorphic and synaptronic event driven core circuit comprising a crossbar of electronic synapses interconnecting electronic neurons, in accordance with an embodiment of the invention.

FIG. 2 shows a hierarchical block diagram of a core circuit 1 including an example of said tile circuit 10, according to an embodiment of the invention. The core circuit 1 includes a transposable SRAM (TRSAM) array 2 of a set of synapses 31. The core circuit 1 includes a cross-point array 3 comprising sense amplifier and driver devices 7 (FIG. 6) for the tile circuit 10. Each synapse stores a bit that can be read, set, or reset from a row (axon) or column (dendrite) in the crossbar 12. Sense amplifier devices amplify signal when an SRAM synapse is being read (e.g., decide if synapse bit true or bit false). Driver devices 7 write the SRAM synapses when instructed such as for updating synaptic weights.

The sense amplifier devices feed into excitatory neurons which in turn connect into axon driver devices and dendrite driver devices. A sense amplifier translates synapse current levels to binary digital signals for integration by connected neurons.

The dendrites have driver devices on one side of the crossbar array and sense amplifiers on the other side of the crossbar array. The axons have driver devices on one side of the crossbar array.

Generally, an excitatory spiking electronic neuron makes its target neurons more likely to fire. Further, an inhibitory spiking electronic neuron makes its targets less likely to fire. Generally, such neurons comprise a single or multi-bit state (membrane potential) that increases when inputs from source excitatory neurons are received, and decreases when inputs from source inhibitory neurons are received. The amount of the increase or decrease is dependent on the strength of the connection from a source neuron to a target neuron.

Figure 3:
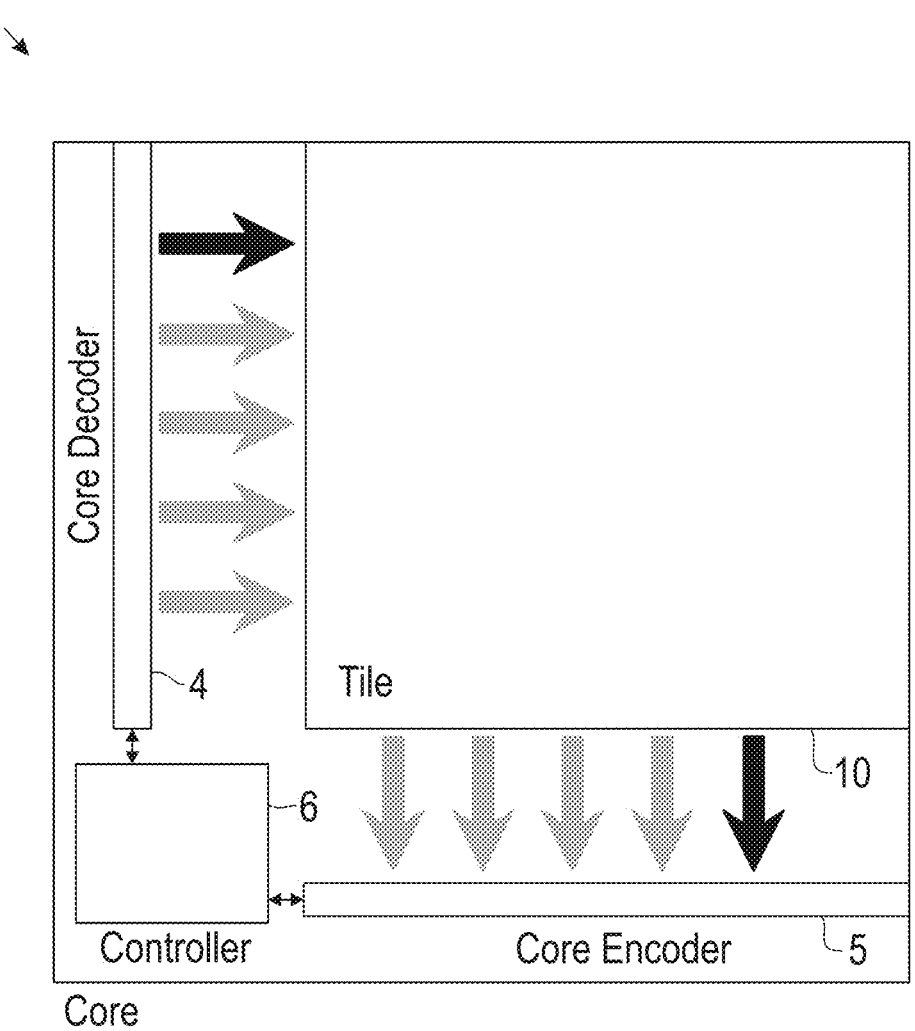
FIG. 3 shows a diagram of details of the core circuit of FIG. 2, in accordance with an embodiment of the invention.

FIG. 3 shows further details of a core 1. As shown in FIG. 3, the core 1 further includes a decoder 4 (address-event receiver), an encoder 5 (address-event transmitter), and a controller 6, according to an embodiment of the invention. The address-event receiver/decoder 4 receives spike events (packets) and transmits them to selected axons. The address-event transmitter/encoder 5 transmits spike events (packets) corresponding to any neuron 11 that spiked. The controller 6 sequences event activity within a time step. The tile circuit 10 includes axon and neuron circuits which interface with said decoder 4 and encoder 5, respectively.

The tile circuit 10 receives and transmits events as one-hot codes: one axon at a time, one neuron at a time. The core 1 decodes address events into a one-hot code, in which one axon at a time is driven. The core encodes the spiking of neurons (one at a time), in the form of a one-hot code, into an address event. From 0 to all axons can be stimulated in a time step, but each one axon only receives one event in one time step. Further, from 0 to all neurons can spike in one time step, but each neuron spikes once in a time step. As such, each axon receives events from a single neuron, otherwise, two neurons may fire in the same time step. Further, a neuron may drive several different axons. As such, in one embodiment, the number of axons can exceed the number of neurons. In another embodiment, the number of neurons and axons can be equal or there can be more neurons than axons.

Axons buffer incoming spikes then drive the crossbar 12 to drive neurons. Neurons add (and subtract) from membrane potential when events arrive (from axons via synapses). Pre-synaptic neurons perform STDP, keep track of when last pre-synaptic event (axon) occurred and inform post-synaptic neurons when a pre-synaptic event occurs (read event). If a post-synaptic event (neuron) occurs, after the pre-synaptic event a decision is made to potentiate (e.g., using the pre-SDTP variable).

Post-synaptic neurons perform STDP, keep track of when last post-synaptic event (neuron) occurred and inform pre-synaptic neurons when a post-synaptic event occurs (neuron event). If pre-synaptic event (axon) occurs, after the post-synaptic event a decision is made to depress (e.g., using the post-STDP variable).

Figure 4:
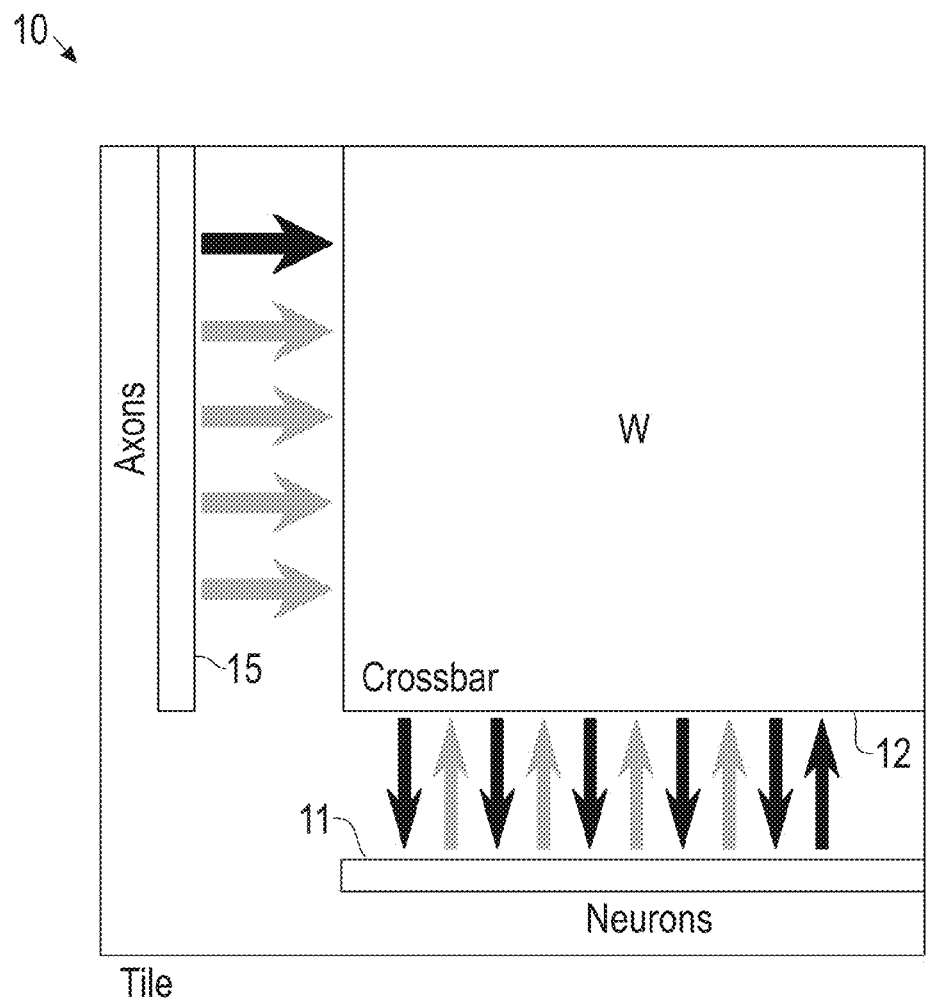
FIG. 4 shows a diagram of details of a tile circuit of the core circuit of FIG. 3, in accordance with an embodiment of the invention.

FIG. 4 shows further details of a tile circuit 10. Neurons 11 spike one at a time, driving the crossbar 12 via the axons 15, such that one axon at a time drives the crossbar 12. When the crossbar 12 receives an axon event, the crossbar 12 drives all neurons in parallel. As such, the crossbar 12 receives events as one-hot codes from both axons and neurons, but the crossbar 12 transmits in parallel to neurons.

The synapses 31 in the crossbar 12 communicate events between the axons and the neurons. A learning such as STDP is applied in the neural network to update synaptic weights of the synapses 31 therein via interface modules such as the driver devices 7 in FIG. 6). The learned weights are then used in the spiking neuron. According to an embodiment of the invention, STDP is performed with order (n), or O(n), circuits (for n presynaptic and n postsynaptic driver devices) for n*n synapses, wherein "*" indicates multiplication. In another embodiment, STDP is event driven rather than continuously computed. If no spikes occur, the no synapses are evaluated for update. One core (e.g., a tile 10) provides and tightly integrates computation (via neurons), communication (via spikes in and out and synaptic fan out), and memory (via synaptic crossbar and neuron state), forming a repeatable architectural element.

In one embodiment, the synapses 31 are binary memory devices, wherein each synapse can have a weight "0" indicating it is non-conducting, or a weight "1" indicating it is conducting. A horizontal update (axonal synapse update in crossbar 12) is for updating (setting/resetting) weights of synapses in a row of the crossbar 12, and a vertical update (dendritic synapse update in crossbar 12) is for updating (setting/resetting) weights of synapses in a column of the crossbar 12.

Based on a neuron spike, an axon 15 sends an event into the crossbar 12, wherein the weight matrix W is read and events are selectively sent out based on the synaptic weights, driving the neurons 11 to which the selected axon 15 connects. In one example, the crossbar 12 also communicates events symmetrically from the neurons 11 to the axons 15, wherein when a neuron sends an event into the crossbar 12, the crossbar 12 reads the weight matrix W and sends out events to all of the axons that are connected to the selected neurons. This symmetrical communication corresponds to a transposable weight matrix.

According to an embodiment of the invention, the transposable weight matrix provides the crossbar 12 with the information required to perform STDP. In STDP, potentiation (weight increase) occurs when a axon (or pre-synaptic) event arrives before a neuron (or post-synaptic) event. Depression (weight decrease) occurs when a pre-synaptic event arrives after a post-synaptic event. To realize potentiation, when a pre-synaptic event arrives, the core 1 records its arrival time, and when a subsequent post-synaptic event arrives, the core 1 calculates the time difference between the events. If the difference is within a desired STDP window, the core 1 can potentiate (or depress for anti-STDP) the synapse. Several implementations are possible, wherein in one implementation the synapses are updated probabilistically (e.g., using a pseudorandom number generator to decide to change the weight from 0 to 1 (or 1 to 0) depending on the time difference). By using stochasticity, an integrator is not required for each synapse and yet a synapse is unlikely to switch with a single pre-post event (or post-pre event) pairing, providing noise immunity.

In a symmetric manner, to realize depression, when a post-synaptic event arrives, the core 1 records its arrival time, and when a subsequent pre-synaptic event arrives, the core 1 calculates the time difference between the events. If the difference is within the STDP window, the core 1 can depress (or potentiate).

As such, the core 1 implements STDP on its weight matrix W. Synapse potentiation may occur when a pre-synaptic (axon i) event precedes a post-synaptic (neuron j) event. The synapse connection between axon and neuron is probabilistically potentiated (SRAM set, $W_{ij}[t] \Rightarrow 1$) wherein probability decreases for increasing time difference between post and pre events. Depression is symmetric and may occur when a post-synaptic (neuron j) event precedes a pre-synaptic (axon i) event. The synapse connection between axon and neuron is probabilistically depressed (SRAM reset, $W_{ij}[t] \Rightarrow 0$) wherein probability decreases for increasing the time difference between pre and post events. As described in more detail further below, an axon selector enables one axon at a time to drive the crossbar 12. Similarly, only one neuron at a time may drive the crossbar 12. As such, the core 1 is a spike processor: spikes in, spikes out.

Figure 5:
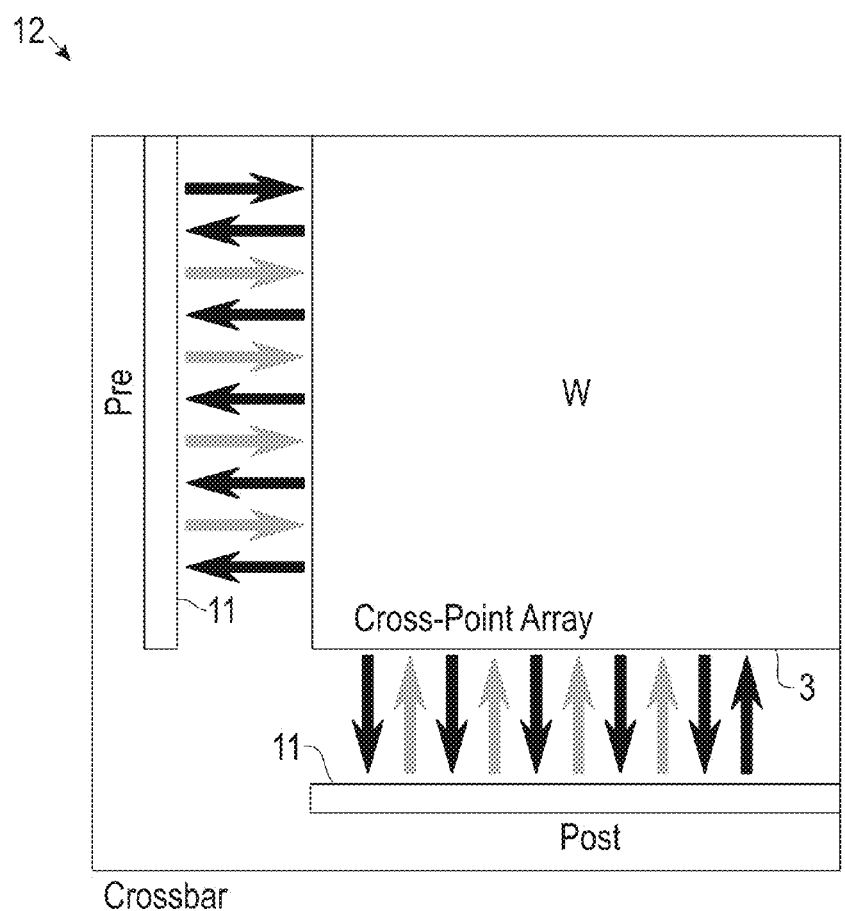
FIG. 5 shows a diagram of details of a crossbar of the tile circuit of FIG. 4, in accordance with an embodiment of the invention.

The synaptic weights can be represented as a matrix W corresponding to the synapses 31. FIG. 5 shows the synaptic weight matrix state to pre-synaptic (Pre) neurons and post-synaptic (Pro) neurons 11, wherein the matrix W is set and reset by said neurons 11. One pre-synaptic neuron at a time drives the crossbar 12 during an axonal read event for a connected synapse. Multiple pre-synaptic circuits can drive the crossbar 12 during an axonal write (set) event for a connected synapse. One post-synaptic neuron at a time drives the crossbar 12 during a neuron read event for a connected synapse. Many post-synaptic circuits can drive the crossbar 12 during a synapse write (reset) event for a connected synapse.

The cross-point array 3 communicates its state to the pre-synaptic circuits and to post-synaptic circuits and is driven by them. In one embodiment, a presynaptic circuit realizes the pre-STDP variable, such that when an axon receives an event and fires, the pre-STDP variable is set to a programmable positive value, and decays by a programmable step down each subsequent time-step. If a postsynaptic event (neuron spike) occurs while the pre-STDP variable is greater than 0, the synapse strength (or bit) increases (or is set to 1) with a probability related to the pre-STDP value.

In one embodiment, a postsynaptic circuit realizes the post-STDP variable such that when a neuron integrates and fires, the post-STDP variable is set to a programmable positive value, and decays by a programmable step down each subsequent time-step. If a presynaptic event (axon spike) occurs while the post-STDP variable is greater than 0, the synapse strength (or bit) decreases (or is set to 0) with a probability related to the post-STDP value.

According to embodiments of the invention, depression (reset) can occur when a pre-synaptic event precedes a post-synaptic event. Depression occurs when an axon event drives a pre-synaptic circuit, which drives the cross-point array 3. In response, the cross-point array 3 drives all of the post-synaptic circuits in parallel. Each post-synaptic circuit keeps track of the last time its associated neuron spiked. When the cross-point array 3 drives the post-synaptic circuit, the post-synaptic circuit draws a random number related to how long ago the neuron spiked (further back in time corresponds to lower probability). If the post-synaptic circuit draws a 1, then the post-synaptic circuit has selected to depress the synapse element in the cross-point array that is driving it, such that the post-synaptic circuit sends a depress signal in the cross-point array.

Potentiation (set) is symmetric with depression, and can occur when a post-synaptic event precedes a pre-synaptic event. Potentiation occurs when an neuron spike event drives the post-synaptic circuit, which drives the cross-point array. In response, the cross-point array drives all of the pre-synaptic circuit circuits in parallel. Each pre-synaptic circuit keeps track of the last time its associated axon received an event. When the cross-point array drives the pre-synaptic circuit, the pre-synaptic circuit draws a random number related to how long ago the axon transmitted a spike (further back in time corresponds to lower probability). Axons receive input from other neurons in the system and transmit that input to the crossbar. If the pre-synaptic circuit draws a 1, then the pre-synaptic circuit has selected to potentiate the synapse element in the cross-point array that is driving it, such that the pre-synaptic circuit sends a potentiate signal in the cross-point array.

Figure 6:
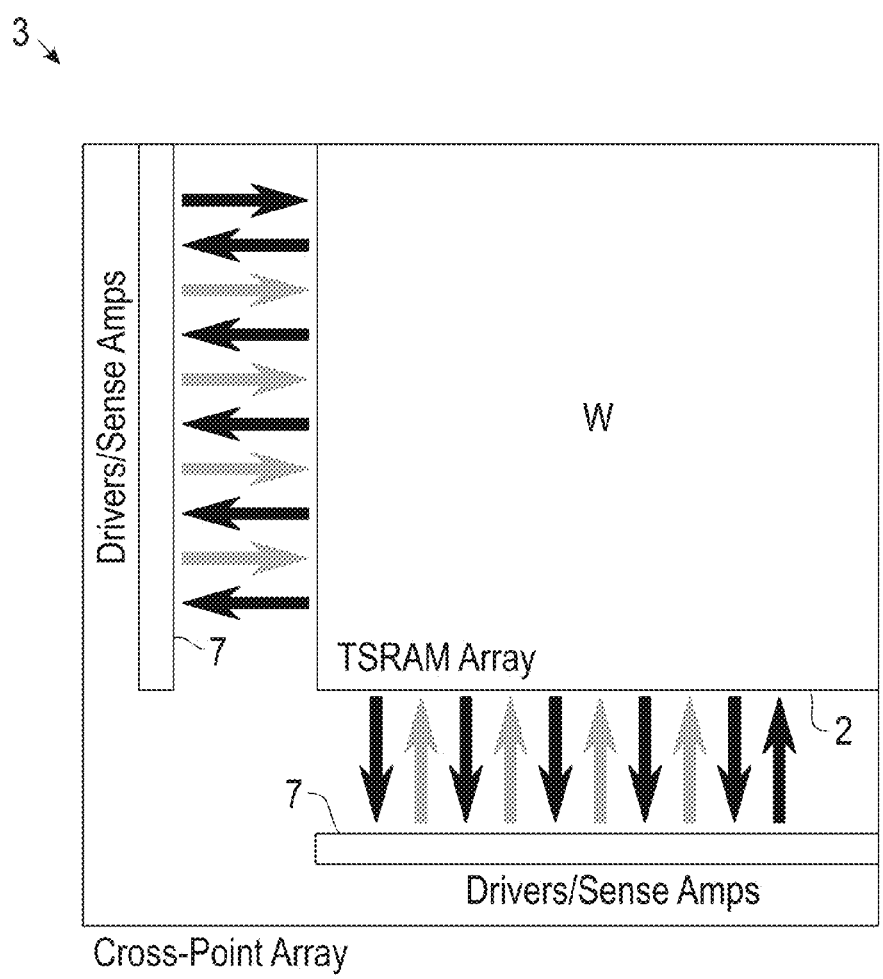
FIG. 6 shows a diagram of details of a synapse cross-point array of the crossbar of FIG. 5, in accordance with an embodiment of the invention.

FIG. 6 shows further details of a cross-point array 3 of FIG. 2. The transposable SRAM array 2 of the synapses is represented by the matrix W wherein words and bit lines can be read/written in a column or row manner. The TSRAM array 2 comprises transposable 8 transistor SRAM cells wherein both rows and columns send word lines and bit lines. Each transistor SRAM cell implements a synapse. As such, a row can be read or written, or a column can be read or written. The TSRAM array 2 can be replaced by an array of any transposable read/write memory devices such as an array of phase change memory (PCM) or magnetic tunnel junction (MTJ).

Figure 7:
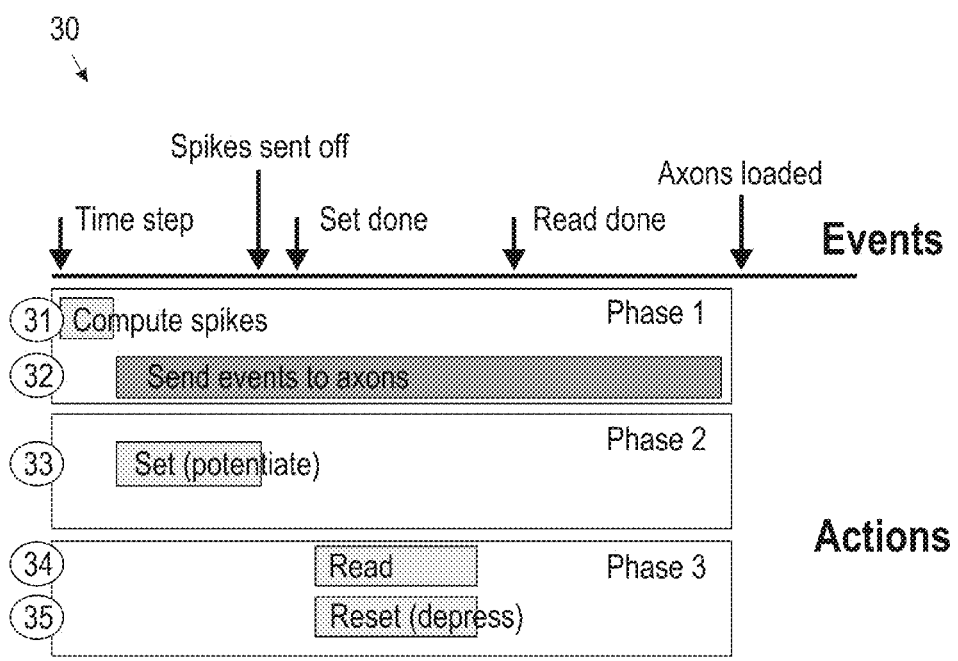
FIG. 7 shows an event driven process in operation of the core circuit of FIG. 2, in accordance with an embodiment of the invention.

FIG. 7 illustrates a process 30 comprising a time sequence of events and functions/actions of a core 1, according to an embodiment of the invention. In each time step, process blocks 31-35 function as follows:

Process block 31: Neurons compute whether or not they spike by integrating inputs thereto. This action is serial with other actions (Phase 1).

Process block 32: Following the spike computation, neurons send out spikes (into a router (not shown)). Spikes arrive at their target axons and are held there (the axons will drive the neurons in two time steps). Preferably, this action occurs immediately after spike computation because routing spikes throughout the core 1 to their targets is likely the critical path in setting network performance (Phase 1).

While spikes are sent throughout the core 1, process blocks 33-35 function as:

Process block 33: Each post-synaptic circuit (whose associated neuron spiked) performs the potentiation (set) computation by interacting with all post-synaptic circuits in parallel.

Process block 34: All of the synapse read operations take place sequentially (axons drive buffered spike event from two time steps ago (t−2)). When each read operation occurs all neurons update their membrane potentials in parallel (this is pipelined such that the next read can start while this computation takes place).

Process block 35: At the same time as the read operation, the post-synaptic circuit performs the depression (reset) computation.

Time steps are based on a hardware clock generate clock cycles. Process 30 breaks up a time step into macro segments. In another embodiment, each event drives a sequence of its own: (1) an axon event initiates a read operation and a reset operation, and (2) a neuron event initiates a transmit operation and a set operation.

Neurons can perform their spike computation at the start of a time step or they can perform it continuously, spiking whenever their input drives them above a threshold. An axon requires buffering using a buffering circuit (such as memory), such that it can hold events from two time steps. This allows the computation and communication to run in parallel, improving performance. Slowing down the computation (by lowering the voltage supply) to match the speed of the communication, power consumption in each core 1 can be reduced.

Computation and communication may be implemented in parallel using axon circuits that provide buffering for two events. During each cycle of the clock, each axon buffers events it receives from any neurons that spiked in time step t (max of one) in a buffer0. When the clock arrives (step t+1), each axon shifts any events it has to a buffer1. When the next clock signal arrives, all events in buffer1 are (sequentially) sent into the crossbar 12 and therefore into the neuron circuits, which compute spikes for time step t+2.

Figure 8:
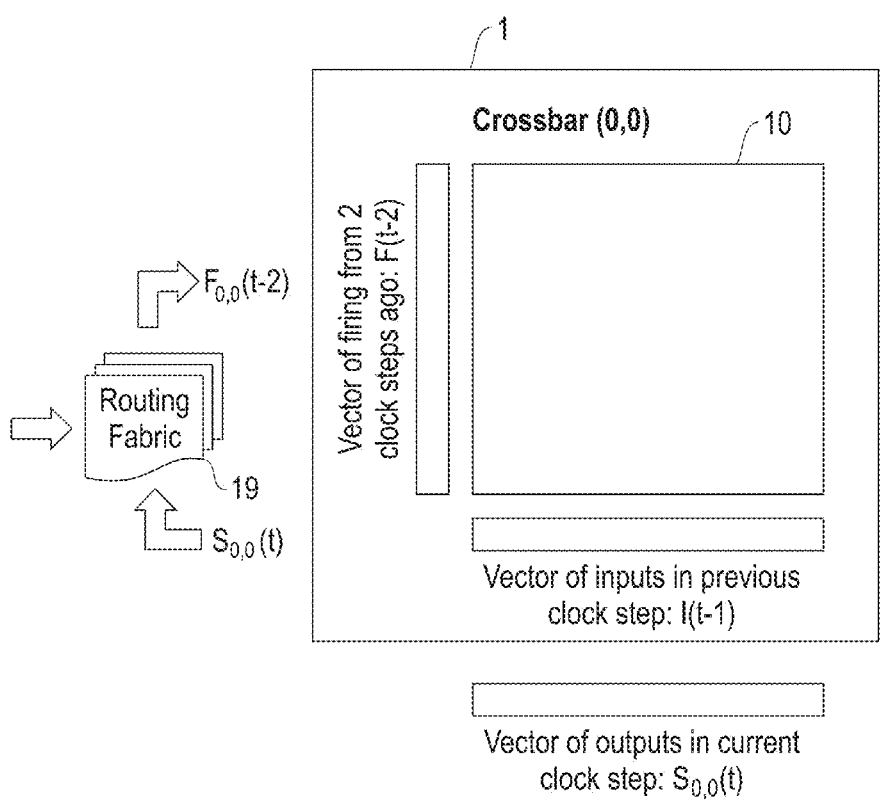
FIG. 8 shows a diagram of the core circuit of FIG. 2 in relation to a routing fabric, in accordance with an embodiment of the invention.

FIG. 8 shows a block diagram of a core 1 and event handling, according to an embodiment of the invention. The core 1 is connected to other circuits such as neural networks comprising other cores 1, using a routing fabric or network 19. F is a binary vector of length A, wherein A represents the number of axons. I is a binary vector of length A, and $S_{x,y}$ is an input from another (or the same) core or tile in the network (from a location x, y in relation to the crossbar). The time (t) is in reference to a frame of spike events being generated (the neuron frame of reference). Vector of firing from 2 clock steps ago is F(t−2), and vector of inputs in previous clock step is I(t−1). Neurons in the core 1 compute their spikes at time t, based on the inputs from t−1 (i.e., I(t−1)). With events entering the routing fabric 19 as spikes, the events are considered to occur at time t. When the events leave the routing fabric as pre-synaptic events, however, they are considered to be two time steps behind. This does not imply that the routing takes two time steps. The router may deliver events within a time step.

Figure 9:
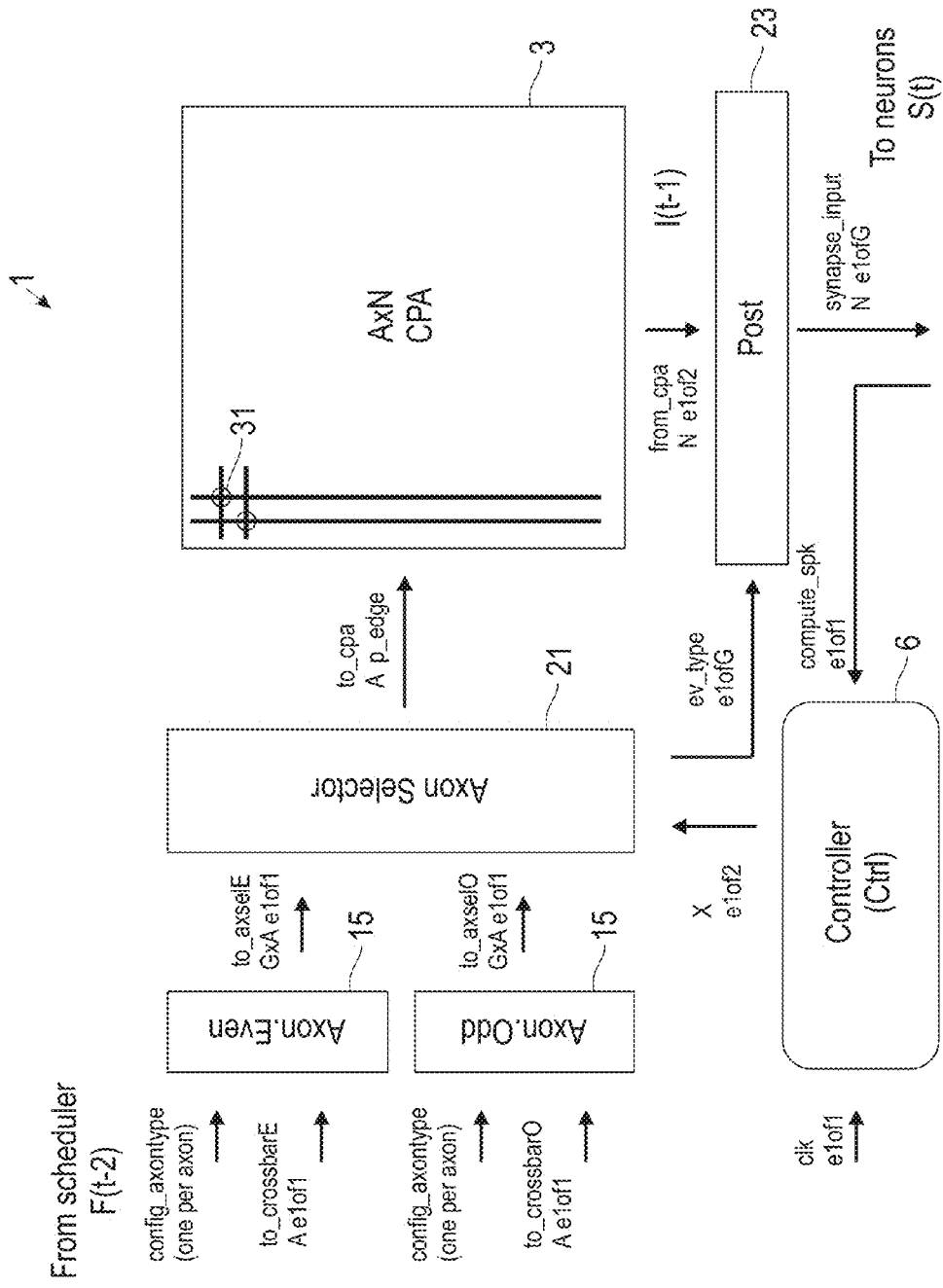
FIG. 9 shows a diagram of further details of the core circuit of FIG. 8, including axon banks and an axon selector, in accordance with an embodiment of the invention.
Figure 10:
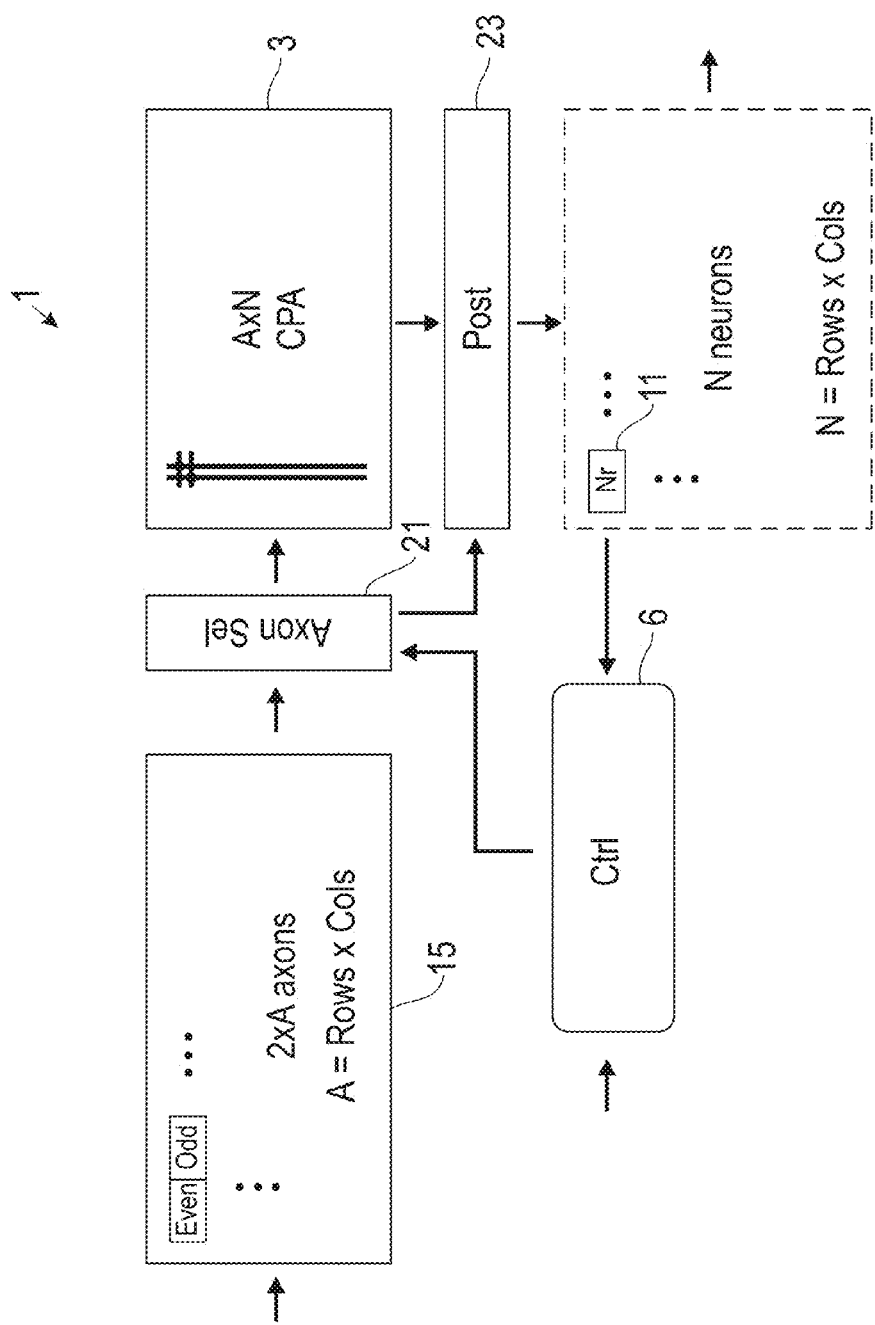
FIG. 10 shows a diagram of further details of the core circuit of FIG. 8, including axon banks, a neuron array and a synapse cross-point array (CPA), in accordance with an embodiment of the invention.
Figure 11:
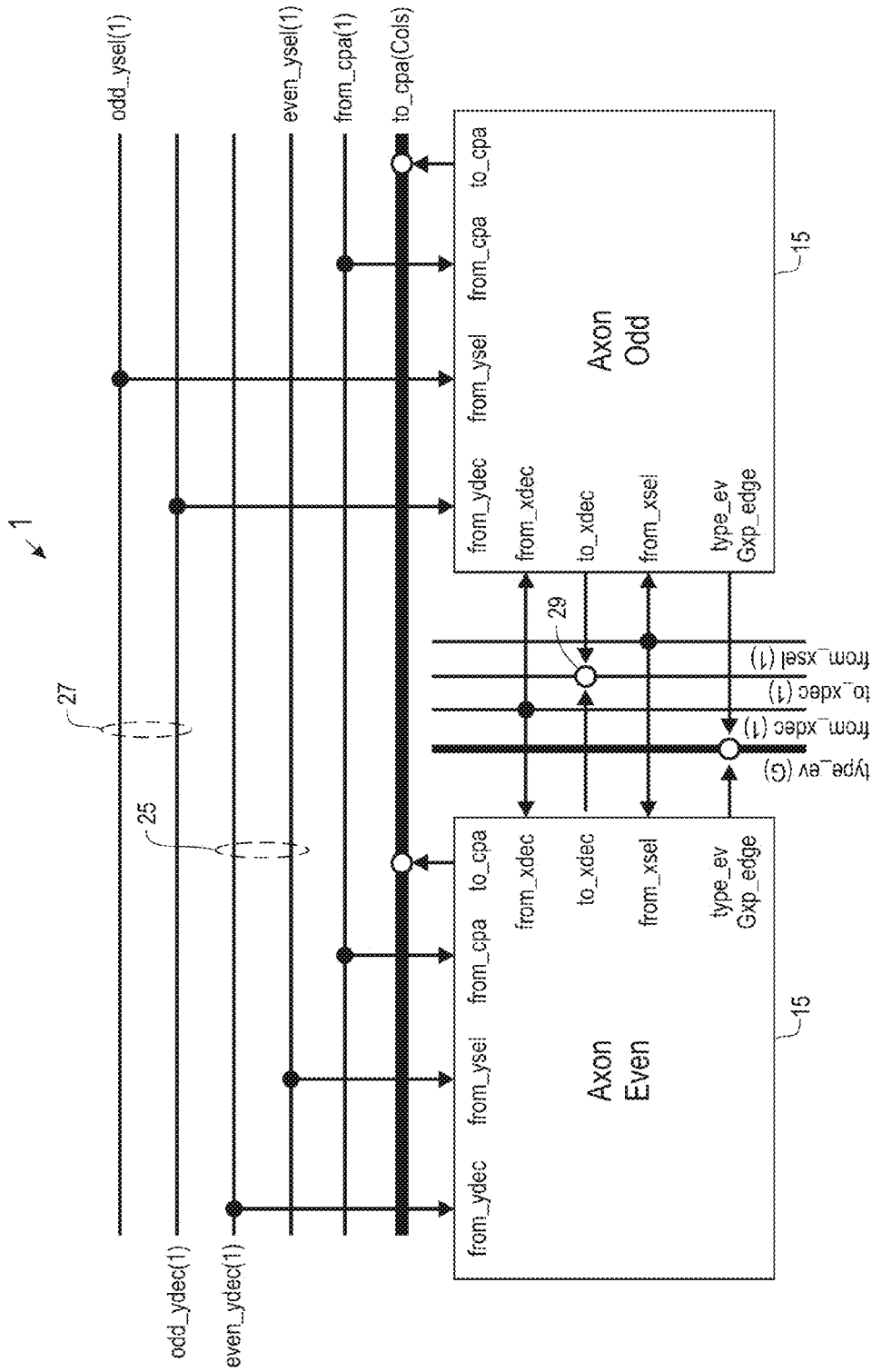
FIG. 11 shows a diagram of axon banks and event signal routing of the core circuit of FIG. 8, in accordance with an embodiment of the invention.

FIG. 9 shows further details of a core 1 and corresponding crossbar function, according to an embodiment of the invention. FIG. 10 shows further details of the core 1 and corresponding crossbar function in conjunction with FIG. 9. FIG. 11 shows further details of the core 1 and axon function in conjunction with FIGS. 13 and 14. Now referring to FIGS. 8-11, the CPA 3 is represented by an AxN matrix of synapses 31, wherein N represents the number of neurons. In a time step, the controller 6 updates its internal state X_internal as X:=FlipParity(X), which is a flip from even to odd and visa-versa. Upon a compute_spk signal, indicating it is acceptable to send events to neurons from the CPA 3, axon.X events are sent along with type info, one at a time, to the CPA 3. In parallel, axon.FlipParity(X) is loaded with incoming events.

As such, on a new time step, the controller 6 updates its internal state by flipping (i.e., toggling) a variable X_internal. In parallel, the neurons (neuron array) are computing all of their spikes (not shown). Once all the spikes have been computed the controller receives said compute_spk signal. Based on the value of X_internal (even or odd), the controller 6 activates its X port which directs an axon selector 21 to select an appropriate axon bank 15 (Axon.Even or Axon.Odd). The controller 6 acknowledges the time step (clk) after the axon selector 21 has completed selection, and the neurons have all sent out their spikes (compute_spk clears).

When the axon selector 21 receives a token on X (even or odd), the axon selector 21 selects through the appropriate axon bank, and loops through one axon at a time. For each stored axon event, the axon selector 21 sends that event through the CPA 3 as well as inform a post circuit 23 as to what type of event it should process (ev_type), clearing each event in the selected axon bank in succession. When complete, the axon selector 21 surrenders control back to the controller 6. Note that information, including axon type, may also be provided directly from the CPA 3.

The post circuit 23 services all pending CPA events, as well as the event type, by delivering them to the appropriate neuron port (excite, inhibit, etc.). The post circuit 23 may include a function to inform the axon selector 21 when it is acceptable to clear both the CPA and event type.

In parallel to the above, a scheduler (e.g., decoder 4 in FIG. 3) delivers events one at a time (arriving from the routing fabric 19 in FIG. 8) into the axon bank that is not selected (i.e., empty axon bank). Both the scheduler and controller 6 keep track of even and odd phases, computed once.

Figure 12:
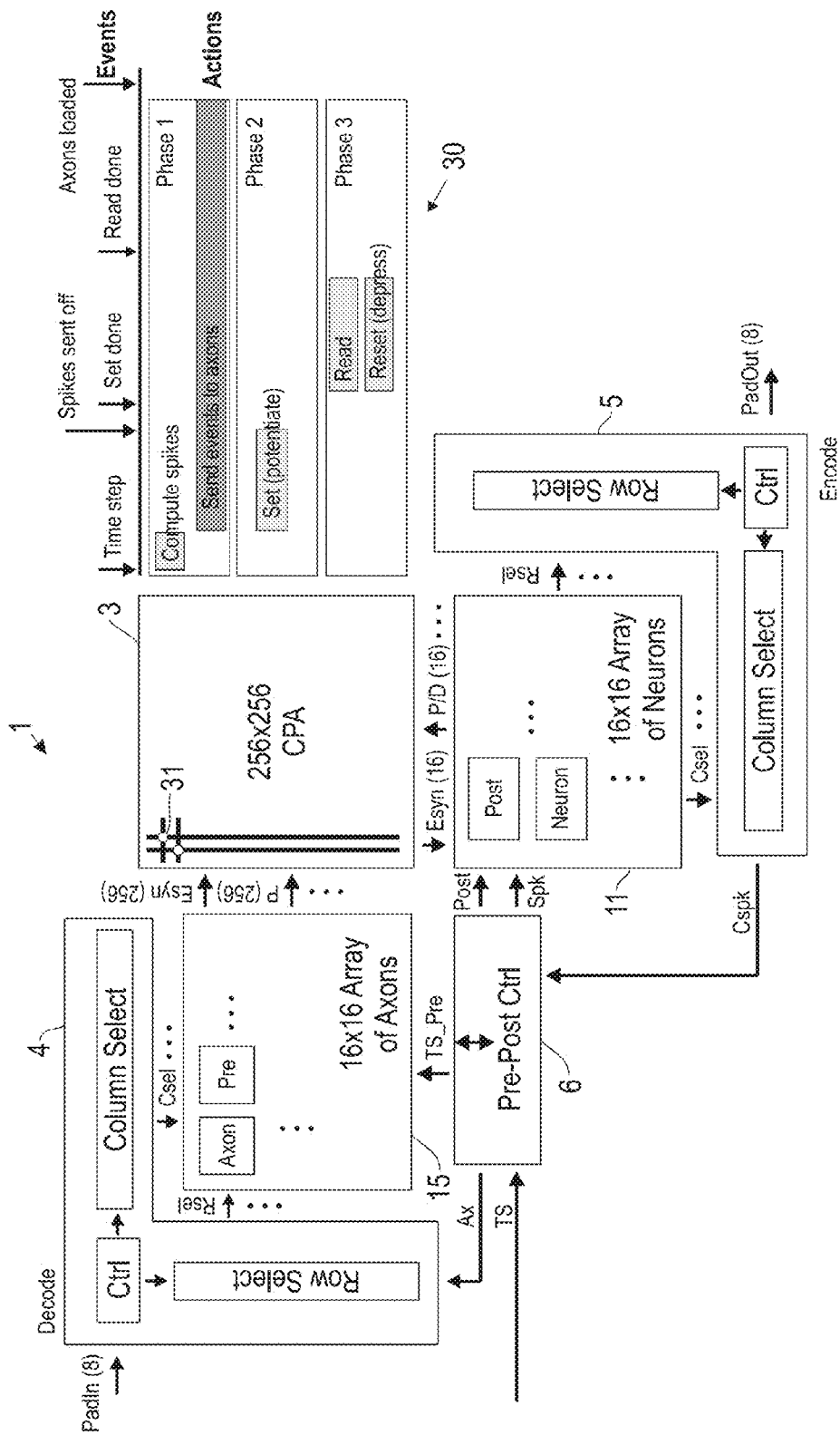
FIG. 12 shows a detailed diagram of event signaling and operation process of the core circuit of FIG. 8, in accordance with an embodiment of the invention.

FIG. 11 represents a horizontal and vertical slice through the axon array. All signals are single rail (p_edge). Signal lines 25 indicate even-specific signals, signals lines 27 represent odd-specific signals. The elements 29 represent logical OR, or wired OR. Solid circles represent connections between wires. FIG. 12 shows further details of the core 1 and a process in conjunction with FIGS. 11-15, according to an embodiment of the invention. When a spike event arrives at the decoder/scheduler 4, it is decoded and sent to the axon array. Within the axon array, a spike is either decoded to a selected even or odd axon block, alternating between time steps. The scheduler is responsible for activating {even, odd}_ydec and from_xdec (shared line), at which point the selected axon block will latch the event and acknowledge through to_xdec, with a symmetric clearing phase. On a time step, the axon selector 21 loops through either all the even or odd axon rows. Specifically, the axon selector 21 probes a row by activating {evenodd}_ysel. All axon blocks in that row send a 1 of G code that specifies: if they have a stored event, and the type of axon (e.g., excitatory, inhibitory, etc.). This code is sent in the column direction. When an axon block is selected (from_xsel), it will then activate its to_cpa signal line if it has an event queued. After collecting acknowledgments (acks) from the CPA 3 (via from_cpa) and the column selector (from_xsel), the axon selector 21 will then reset its state.

The above architecture maintains one-to-one correspondence between hardware and software. As such a hardware model and a software model are in one-to-one correspondence, for both the learning and non-learning designs.

Figure 13:
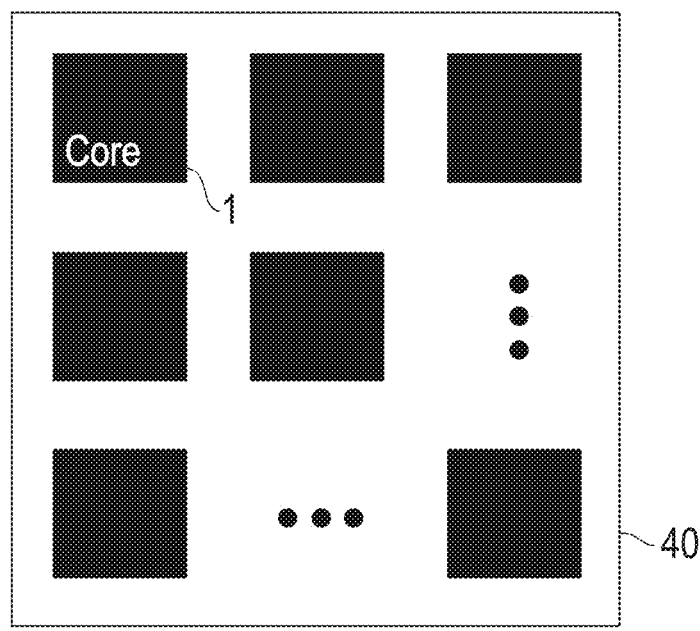
FIG. 13 shows a diagram of a neural network comprising multiple interconnected core circuits, in accordance with an embodiment of the invention.

FIG. 13 shows a neural network 40 comprising multiple interconnected cores 1 (e.g., via a communication fabric), according to an embodiment of the invention. The neural network 40 may be implemented as a circuit chip.

Figure 14:
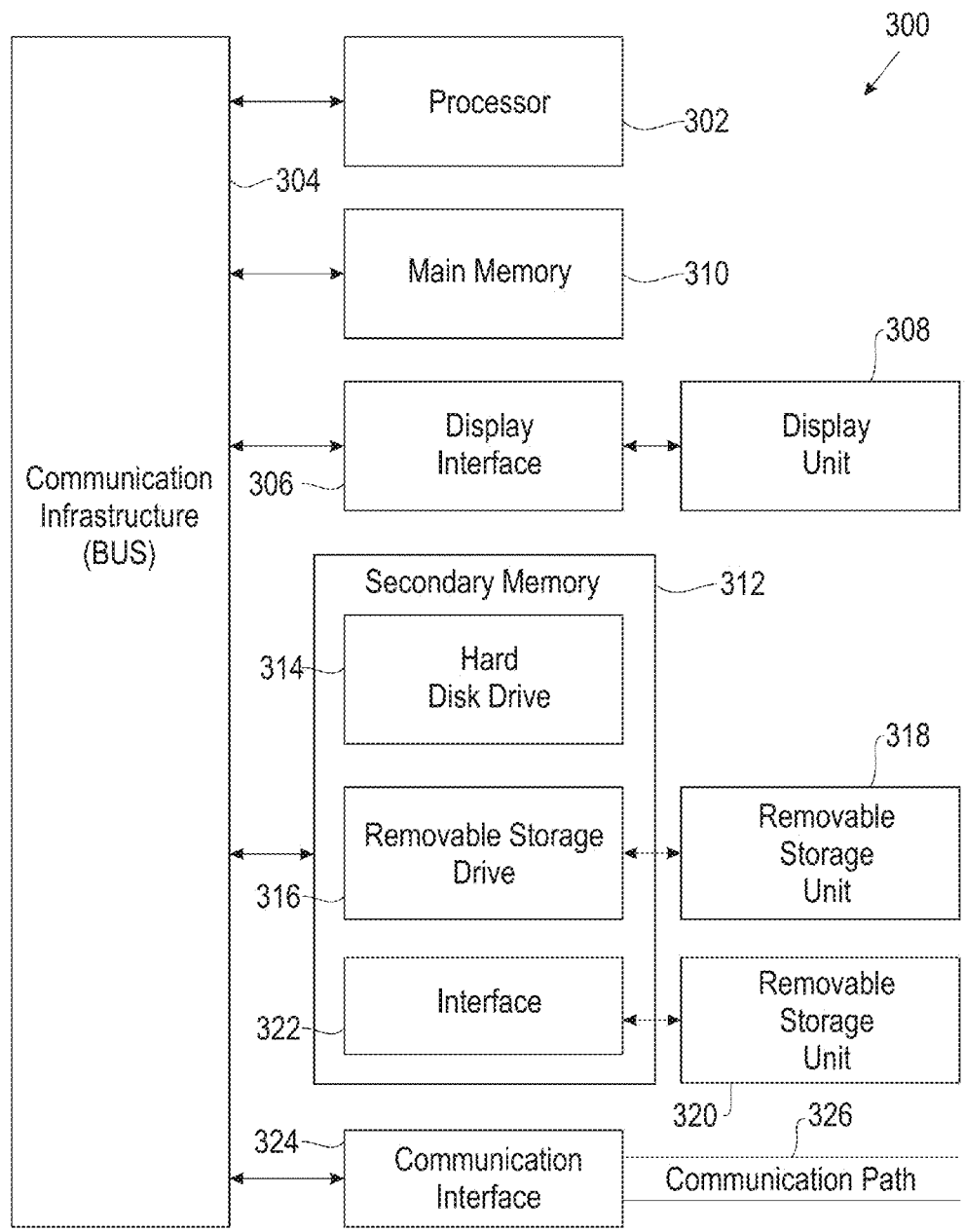
FIG. 14 shows a high level block diagram of an information processing system useful for implementing one embodiment of the present invention.

FIG. 14 is a high level block diagram showing an information processing system 300 useful for implementing one embodiment of the present invention. The computer system includes one or more processors, such as processor 302. The processor 302 is connected to a communication infrastructure 304 (e.g., a communications bus, cross-over bar, or network).

The computer system can include a display interface 306 that forwards graphics, text, and other data from the communication infrastructure 304 (or from a frame buffer not shown) for display on a display unit 308. The computer system also includes a main memory 310, preferably random access memory (RAM), and may also include a secondary memory 312. The secondary memory 312 may include, for example, a hard disk drive 314 and/or a removable storage drive 316, representing, for example, a floppy disk drive, a magnetic tape drive, or an optical disk drive. The removable storage drive 316 reads from and/or writes to a removable storage unit 318 in a manner well known to those having ordinary skill in the art. Removable storage unit 318 represents, for example, a floppy disk, a compact disc, a magnetic tape, or an optical disk, etc. which is read by and written to by removable storage drive 316. As will be appreciated, the removable storage unit 318 includes a computer readable medium having stored therein computer software and/or data.

In alternative embodiments, the secondary memory 312 may include other similar means for allowing computer programs or other instructions to be loaded into the computer system. Such means may include, for example, a removable storage unit 320 and an interface 322. Examples of such means may include a program package and package interface (such as that found in video game devices), a removable memory chip (such as an EPROM, or PROM) and associated socket, and other removable storage units 320 and interfaces 322 which allow software and data to be transferred from the removable storage unit 320 to the computer system.

The computer system may also include a communication interface 324. Communication interface 324 allows software and data to be transferred between the computer system and external devices. Examples of communication interface 324 may include a modem, a network interface (such as an Ethernet card), a communication port, or a PCMCIA slot and card, etc. Software and data transferred via communication interface 324 are in the form of signals which may be, for example, electronic, electromagnetic, optical, or other signals capable of being received by communication interface 324. These signals are provided to communication interface 324 via a communication path (i.e., channel) 326. This communication path 326 carries signals and may be implemented using wire or cable, fiber optics, a phone line, a cellular phone link, an RF link, and/or other communication channels.

In this document, the terms "computer program medium," "computer usable medium," and "computer readable medium" are used to generally refer to media such as main memory 310 and secondary memory 312, removable storage drive 316, and a hard disk installed in hard disk drive 314.

Computer programs (also called computer control logic) are stored in main memory 310 and/or secondary memory 312. Computer programs may also be received via communication interface 324. Such computer programs, when run, enable the computer system to perform the features of the present invention as discussed herein. In particular, the computer programs, when run, enable the processor 302 to perform the features of the computer system. Accordingly, such computer programs represent controllers of the computer system.

From the above description, it can be seen that the present invention provides a system, computer program product, and method for implementing the embodiments of the invention. References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A neural network, comprising:
a core circuit comprising:
a plurality of digital neurons; and
an electronic synapse array comprising:
multiple digital synapses interconnecting the neurons, wherein each synapse interconnects an axon of a pre-synaptic neuron with a dendrite of a post-synaptic neuron, wherein the synapse array transmits an input spike event from an axon of a pre-synaptic neuron to multiple neurons in parallel, and wherein each neuron integrates input spike events and generates a spike event in response to the integrated input spikes exceeding a threshold; and
an interface module for performing synaptic learning using multiple drivers devices including at least one presynaptic driver device and at least one postsynaptic driver device for updating synaptic weights of the synapses, wherein the number of driver devices is proportional to the number of synapses included in the synapse array;
a controller that sequences spike event activity within each time step for operation of the neural network and access to the synapse array;
an encoder that transmits spike events corresponding to spiking neurons; and
a decoder that sequentially receives spike events and provides the spike events to selected axons in the synapse array.

2. The neural network of claim 1, wherein the controller sequences spike event activity within each time step for operation of the neural network and access to the synapse array in a discrete-time manner for a deterministic operation and one-to-one correspondence to a software model.

3. The neural network of claim 1, wherein:
the controller sequences spike event activity within each time step for operation of the neural network and access to the synapse array in one of a continuous manner and a discrete-time manner;
the synapse array comprises a crossbar memory array; and
the crossbar memory array receives spike events as one-hot codes from both axons and neurons, wherein one axon at a time drives the crossbar memory array by transmitting a signal thereon, and wherein the crossbar memory array transmits spike events in parallel to multiple neurons utilizing transposable access to the crossbar memory array.

4. The neural network of claim 3, wherein:
spiking neurons are selected one at a time, wherein each spike event generated by each spiking neuron is sent to one or more corresponding axons on the core circuit or other core circuits.

5. The neural network of claim 4, wherein:
each synapse stores information that can be read and updated; and
one axon at a time drives the crossbar memory array via a spike event during an axonal read of a synapse.

6. The neural network of claim 5, wherein:
one post-synaptic neuron at a time drives the crossbar memory array via a spike event during a neuron read of a synapse.

7. The neural network of claim 6, wherein:
multiple axons drive the crossbar memory array via spike events during an axonal update of synapses during a neuron read of a synapse.

8. The neural network of claim 7, wherein:
multiple post-synaptic neurons drive the crossbar memory array via spike events during an update of a synapse during an axonal read of a synapse.

9. The neural network of claim 8, wherein:
an axonal spike event causes a read of a synapse in a sequence of continuous or discrete time steps.

10. The neural network of claim 9, wherein:
reading of a synapse is followed by setting or resetting of said synapse by one or more of a neuron and an axon.

11. The neural network of claim 1,
wherein the interface module includes O(n) driver devices comprising n presynaptic driver devices and n postsynaptic driver devices for n*n synapses.

12. The neural network of claim 9, wherein:
said synaptic learning is event driven based on spike events for updating synaptic weights; and
the neural network provides computation via neurons, communication via spike events and synapses, and memory via the synapses and neuron states of the neurons, thereby forming a repeatable neural architectural element.

13. The neural network of claim 9, further comprising multiple core circuits interconnected via an event routing network.

14. A method for producing spike-timing dependent plasticity in a neural network circuit neural network, comprising:
in a core neural circuit comprising a plurality of digital neurons and an electronic synapse array including multiple digital synapses interconnecting the neurons, integrating input spikes in an integrate and fire digital neuron, and upon the integrated inputs exceeding a threshold, sending a spike event to digital synapses interconnecting the neuron to other neurons, wherein each synapse interconnects an axon of a pre-synaptic neuron with a dendrite of a post-synaptic neuron, wherein the synapse array transmits an input spike event from an axon of a pre-synaptic neuron to multiple neurons in parallel, wherein the synapse array further includes an interface module for performing synaptic learning using multiple drivers devices including at least one presynaptic driver device and at least one postsynaptic driver device for updating synaptic weights of the synapses, and wherein the number of driver devices is proportional to the number of synapses included in the synapse array; and
sequencing spike events within each time step for operation of the neural network and access to the synapse array, using a probability to potentiate and depress synapses.

15. The method of claim 14, further comprising:
transmitting spike events corresponding to spiking neurons; and
sequentially receiving spike events and providing the spike events to selected axons in the synapse array.

16. The method of claim 14, further comprising sequencing spike event activity within each time step for operation of the neural network and access to the synapse array in a discrete-time manner for a deterministic operation and one-to-one correspondence to a software model.

17. The method of claim 14, wherein:
the synapse array comprises a crossbar including said synapses interconnecting said neurons; and
the method further comprising:
sequencing spike events within each time step for operation of the neural network and access to the synapse array in one of a continuous manner and a discrete-time manner;
receiving spike events as one-hot codes from both axons and neurons, wherein one axon at a time drives the crossbar by transmitting a signal thereon, and wherein the crossbar transmits spiking events in parallel to multiple neurons; and
said neurons spiking one at a time and sending spike events to corresponding axons.

18. The method of claim 17, further comprising:
each synapse storing information that can be read and updated; and
one axon at a time driving the crossbar via a spike event during an axonal read of a synapse.

19. The method of claim 18, further comprising:
one post-synaptic neuron at a time driving the crossbar via a spike event during a neuron read of a synapse.

20. The method of claim 19, further comprising:
multiple axons driving the crossbar via spike events during an axonal update of synapses during a neuron read of a synapse.

21. The method of claim 20, further comprising:
multiple post-synaptic neurons driving the crossbar via spike events during an update of a synapse during an axonal read.

22. The method of claim 21, wherein:
an axonal spike event causes a read of a synapse in a sequence of continuous or discrete time steps.

23. The method of claim 22, wherein:
reading of a synapse is followed by setting or resetting of said synapse by one or more of a neuron and an axon.

24. The method of claim 14,
wherein the interface module includes O(n) driver devices comprising n presynaptic driver devices and n postsynaptic driver devices for n*n synapses.

25. A computer program product for producing spike-timing dependent plasticity in a neural network, the computer program product comprising:
a computer readable storage medium having computer usable program code embodied therewith, the computer usable code comprising:
computer usable program code configured to integrate input spikes in an integrate and fire electronic neuron, and upon the integrated inputs exceeding a threshold, sending a spike event to electronics synapses interconnecting the neuron to other neurons via a synapse array, wherein the synapse array comprises multiple synapses interconnecting a plurality of digital neurons, wherein each synapse interconnects an axon of a pre-synaptic neuron with a dendrite of a post-synaptic neuron, wherein the synapse array transmits an input spike event from an axon of a pre-synaptic neuron to multiple neurons in parallel, wherein the synapse array further includes an interface module for performing synaptic learning using multiple drivers devices including at least one presynaptic driver device and at least one postsynaptic driver device for updating synaptic weights of the synapses, and wherein the number of driver devices is proportional to the number of synapses included in the synapse array; and
computer usable program code configured to sequence spike events within each time step for operation of the neural network and access to the synapse array in one of: a continuous manner and a discrete-time manner.

* * * * *